United States Patent
Chen et al.

(10) Patent No.: US 9,147,021 B2
(45) Date of Patent: Sep. 29, 2015

(54) DATA PROCESSING METHOD AND DEVICE USING THE SAME

(75) Inventors: Hsin-Jung Chen, Jiaoxi Township, Yilan County (TW); Feng-Hsiang Lo, Jhubei (TW)

(73) Assignee: INDUSTRIAL TECHNOLOGY RESEARCH INSTITUTE, Hsinchu (TW)

( * ) Notice: Subject to any disclaimer, the term of this patent is extended or adjusted under 35 U.S.C. 154(b) by 764 days.

(21) Appl. No.: 13/440,886

(22) Filed: Apr. 5, 2012

(65) Prior Publication Data

US 2013/0127834 A1 May 23, 2013

(30) Foreign Application Priority Data

Nov. 18, 2011 (TW) .............................. 100142398 A (51) Int. Cl.
*G09G 5/00* (2006.01)
*G06F 17/50* (2006.01)

(52) U.S. Cl.
CPC .................................. *G06F 17/5036* (2013.01)

(58) Field of Classification Search
CPC ........................................................ G06T 5/00
USPC ........................................................ 345/619
See application file for complete search history.

(56) References Cited

U.S. PATENT DOCUMENTS

| | | | |
|---|---|---|---|
| 6,430,713 B1 * | 8/2002 | Marcus et al. ................. | 714/701 |
| 7,042,926 B2 * | 5/2006 | Yellin et al. ................... | 375/147 |
| 7,219,085 B2 * | 5/2007 | Buck et al. ...................... | 706/12 |
| 7,486,820 B2 | 2/2009 | Grady | |
| 7,565,010 B2 | 7/2009 | Grady | |
| 7,669,152 B1 | 2/2010 | Tcherniaev et al. | |
| 7,729,537 B2 | 6/2010 | Grady et al. | |
| 8,295,374 B2 * | 10/2012 | Kuo et al. ...................... | 375/260 |
| 8,514,269 B2 * | 8/2013 | Adler et al. ..................... | 348/46 |
| 8,908,766 B2 * | 12/2014 | Pace .......................... | 375/240.16 |
| 2005/0002468 A1 * | 1/2005 | Walton et al. .................. | 375/267 |
| 2006/0285531 A1 * | 12/2006 | Howard et al. ................ | 370/343 |
| 2008/0075183 A1 * | 3/2008 | Ponnampalam et al. ..... | 375/260 |
| 2010/0002786 A1 * | 1/2010 | Kuo et al. ...................... | 375/260 |

(Continued)

FOREIGN PATENT DOCUMENTS

| | | |
|---|---|---|
| CN | 101593349 | 12/2009 |
| TW | 200818865 | 4/2008 |

OTHER PUBLICATIONS

English language translation of abstract of TW 200818865 (published Apr. 16, 2008).

(Continued)

*Primary Examiner* — Javid A Amini
(74) *Attorney, Agent, or Firm* — McClure, Qualey & Rodack, LLP (57) ABSTRACT

A computer implemented data processing method for recursively approximating a proper value for a target matrix includes the following steps of: determining whether the target matrix corresponds to a low complexity condition; if so, obtaining a first updated target matrix according to a first variance, relevant to a second iteration parameter, and a first iteration parameter, wherein the first and the second iteration parameters correspond to fixed values; if not, obtaining a second updated target matrix according to a second variance, relevant to a fourth iteration parameter, and a third iteration parameter, wherein the third and the fourth parameters are related to the target matrix.

18 Claims, 6 Drawing Sheets

(56) References Cited

U.S. PATENT DOCUMENTS

| | | | |
|---|---|---|---|
| 2011/0026808 A1* | 2/2011 | Kim et al. | 382/154 |
| 2011/0043604 A1* | 2/2011 | Peleg et al. | 348/36 |
| 2011/0109720 A1* | 5/2011 | Smolic et al. | 348/43 |
| 2012/0044244 A1* | 2/2012 | Huang et al. | 345/419 |
| 2013/0083854 A1 | 4/2013 | Pace | |

OTHER PUBLICATIONS

English language translation of abstract of CN 101593349 (published Dec. 2, 2009).

Grady, L; "Random Walks for Image Segmentation;" IEEE Transactions on Pattern Analysis and Machine Intelligence; vol. 28; No. 11; Nov. 2006; pp. 1768-1783.

Hirschmuller, H.; "Accurate and Efficient Stereo Processing by Semi-Global Matching and Mutual Information;" IEEE Conference on Computer Vision and Pattern Recognition (CVPR); Jun. 2005; pp. 1-8.

Scharstein, D., et al.; "A Taxonomy and Evaluation of Dense Two-Frame Stereo Correspondence Algorithms;" Microsoft Research Corporation Technical Report; Nov. 2001; pp. 1-61.

* cited by examiner

DATA PROCESSING METHOD AND DEVICE USING THE SAME

This application claims the benefit of Taiwan application Serial No. 100142398 filed Nov. 18, 2011, the subject matter of which is incorporated herein by reference.

BACKGROUND

1. Technical Field

The disclosure relates in general to a computer-implemented data processing method and data processing device using the same.

2. Description of the Related Art

Along with technology changes with each passing days, varies kinds of data processing methods have been developed for enhancing seeing and hearing entertainment experience for consumers, such as three dimensional (3D) multimedia processing technologies, on which more attention and effort have been paid by the industries. Generally, how to have two dimensional (2D) image content converted into 3D stereo image and stereo matching technologies have been an urgent and prominent object of the industries.

In present skill, multiple image processing methods have been developed for stereo image/video processing application. However, image processors are usually equipped with hardware having limited computational capability. As such, how to provide an adequate scheme capable of reducing computational complexity and enhancing image processing scheme has became a prominent goal for the industries.

SUMMARY

According to a first aspect of the present disclosure, a computer implemented data processing method, applied in a data processing system for achieving iterative approximation of a target matrix, is provided. The data processing method includes the following steps of: determining whether the target matrix corresponds to a low complexity condition by a determining unit of a data processing device; when the target matrix corresponds to the low complexity condition, driving an iteration unit with fixed-value parameters of the data processing device by the determining unit for obtaining a first updated target matrix according to a first variance and a first iteration parameter, wherein the first variance is relevant to a second iteration parameter, and the first and the second iteration parameters correspond to fixed values; and when the target matrix does not correspond to the low complexity condition, driving an iteration unit with unfixed-value parameters of the data processing device by the determining unit for obtaining a second updated target matrix according to a second variance and a third iteration parameter, wherein the second variance is relevant to a fourth iteration parameter, and the third and the fourth iteration parameters are related to the target matrix.

According to a second aspect of the present disclosure, a data processing device, applied in a data processing system for achieving iterative approximation of a target matrix, is provided. The data processing device includes a determining unit, an iteration unit with fixed-value parameters, and an iteration unit with unfixed-value parameters. The determining unit receives the target matrix and determines whether the target matrix corresponds to a low complexity condition. When the target matrix corresponds to the low complexity condition, the determining unit provides a first command, and when the target matrix does not correspond to the low complexity condition, the determining unit provides a second command. The iteration unit with fixed-value parameters obtains a first updated target matrix according to a first variance and a first iteration parameter in response to the first command, wherein the first variance is relevant to a second iteration parameter, and the first and the second iteration parameters correspond to fixed values. The iteration unit with unfixed-value parameters obtains a second updated target matrix according to a second variance and a third iteration parameter in response to the second command, wherein the second variance is relevant to a fourth iteration parameter, and the third and the fourth parameters are related to the target matrix.

The above and other aspects of the disclosure will become better understood with regard to the following detailed description of the non-limiting embodiment(s). The following description is made with reference to the accompanying drawings.

DETAILED DESCRIPTION

The data processing method according to the present embodiment selectively executes iterations with different computational complexity in response to a complexity condition of a to-be-calculated target matrix.

Figure 1:
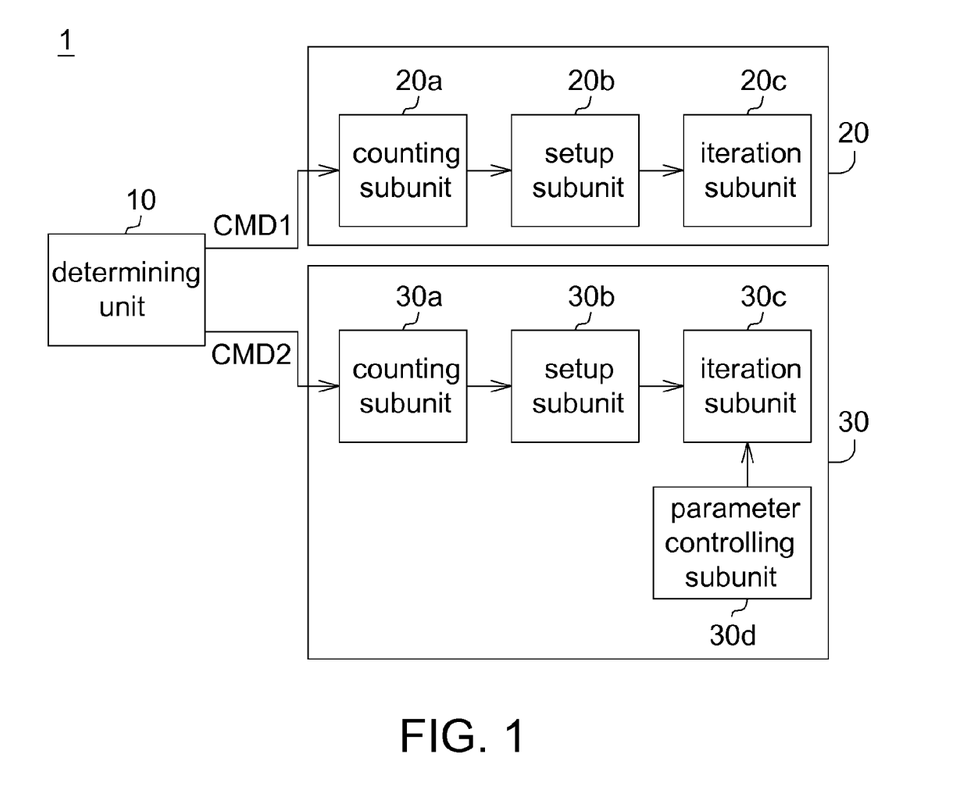
FIG. 1 is a block diagram of a data processing device according to an embodiment.
Figure 2:
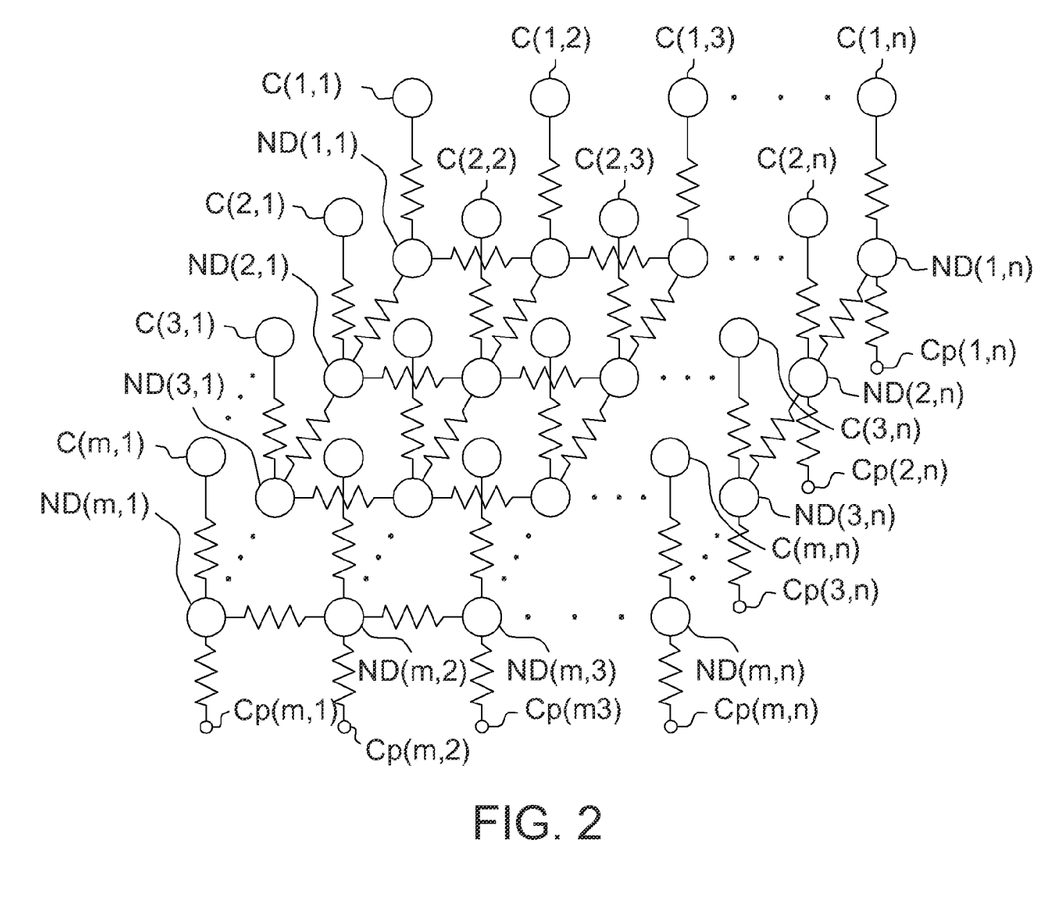
FIG. 2 is circuit diagram of a simulation circuit model M according to the present embodiment.

Referring to FIG. 1, a block diagram of a data processing device according to an embodiment. The data processing device 1 is applied in a data processing system, implemented with computers, for achieving iterative approximation of a target matrix x. For example, the data processing system establishes a simulation circuit model M, as shown in FIG. 2, for the to be processed input data, and applies data processing operations, such as a stereo image/video computation operation of stereo matching, two dimensional (2D) to three dimensional (3D) conversion operation, or smooth operation of image, on the to be processed input data.

More specifically, the simulation circuit model M includes m×n sub-circuit models M(1,1), M(1,2), . . . , M(m,n), which, for example, have circuit structures similar to each other, wherein m and n are natural numbers greater than 1. Herein below, only the sub-circuit model M(i,j) of the simulation circuit model M is cited for an example for illustrating each and every of the m×n sub-circuit models M(1,1) to M(m,n), wherein i and j are a natural number smaller than or equal to m and a natural number smaller than or equal to n, respectively.

Figure 3:
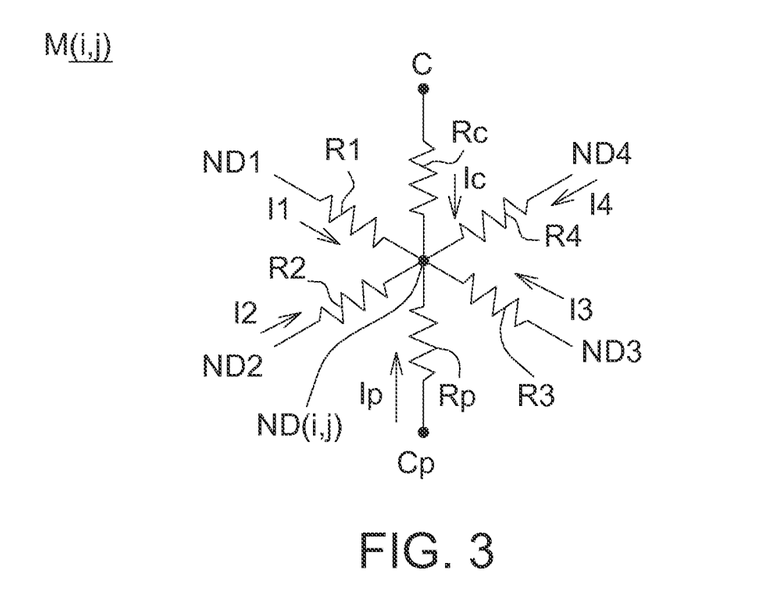
FIG. 3 is a circuit diagram of a sub-circuit model M(i,j) according to the present embodiment.

Referring to FIG. 3, a circuit diagram of the sub-circuit model M(i,j) according to the present embodiment is shown. The sub-circuit model M(i,j) includes data nodes C(i,j) and CP(i,j), corresponding to respective known data, a diffusion node ND(i,j), data connection devices Rc and Rp, and z diffusion connection devices R1, R2, . . . , Rz, wherein z is a natural number, and the data connection device Rc, Rp, and the diffusion connection devices R1-Rz are realized by, e.g. resistance elements.

In detail, the data connection device Rc is coupled between the data nodes C(i,j) and the diffusion node ND(i,j), the data connection device R is coupled between the data node CP(i,j) and the diffusion node ND(i,j); one ends of each of the z diffusion connection devices R1 to Rz are coupled to the diffusion node ND(i,j), and the other ends are coupled to the respective diffusion nodes ND1, ND2, ND3, and ND4 of other sub-circuit models of the simulation circuit model M. For example, the parameter z is equal to 4, and the other ends of the diffusion connection devices R1 to R4 are respectively coupled to the diffusion nodes ND(i−1, j), ND(i,j−1), ND(i, j+1), and ND(i+1, j) of the sub-circuit models M(i−1,j), M(i, j−1), M(i,j+1), and M(i+1, j).

By the same analogy, all m×n diffusion nodes ND(1,1)-ND(m,n) of the m×n sub-circuit models M(1,1)-M(m,n) are coupled via corresponding diffusion connection devices, so that the sub-circuit models M(1,1)-M(m,n) of the simulation circuit model M are connected together and accordingly form a resistor network. For example, the resistance values of the data connection devices Rc and Rp of the simulation circuit models M(1,1)-M(m,n) are substantially equal, fixed, and determined by the user; and the resistance value $\omega_{diffuse}$ of each of the z diffusion connection devices R1-Rz of the simulation circuit model M(i,j) satisfies the following equation:

$$R_{diffuse} = \frac{\alpha}{e^{-\frac{\beta}{1+\gamma G_s(i,j)}\|C_t - C_n\|^2}}$$

Wherein $\alpha$, $\beta$, $\gamma, C_t, C_n$ are predetermined parameters, and $G_s(i, j)$ is a gradient function. In the example that the operation carried out by the data processing system is the stereo image/video computation operation, $C_t$ and $C_n$ are respectively the color information corresponding to pixel data corresponding to the position (i,j) in the original left view-angle image, and that in the original right view-angle image; $G_s$ (i, j) is the image gradient, such as a gray level gradient, a RGB gradient, for full color gradient, corresponding to the position (i,j) in the original left and right view-angle images.

The data processing system has known data provided to the data node C(i,j) and Cp(i,j) within the simulation circuit model M, and accordingly incurs redistribution of voltages among the simulation circuit model M, so that m×n pieces of output result data can be respectively obtained on the diffusion nodes of the m×n sub-circuit models. For example, in the example that the operation carried out by the data processing system is the stereo image/video computation operation, the operation of obtaining the known data and having them supplied to the data nodes C(i,j) and Cp(i,j), achieved by the data processing system, can be illustrated in a flow including the following steps. Firstly, first view-angle image data DvL and second view-angle image data DvR, i.e. image data respectively corresponding to the left view-angle and the right view-angle, are obtained.

Next, w pieces of horizontal binocular disparities Dx1, Dx2, . . . , and Dxw are determined, and first original disparity DIS_k is obtained when the kth piece of horizontal binocular disparity Dxk is presented, by mapping the first view-angle image data DvL to the second view-angle image data DvR, wherein k, which is a natural number greater than or equal to 1 and also smaller than or equal to w, is an index for image comparing window. For example, the first original disparity DIS_k includes m×n pieces of original pixel-based disparities DIS(1,1,Dxk), DIS(1,2,Dxk), . . . , and DIS(m,n,Dxk), wherein the m×n pieces of original pixel-based disparities DSI(1,1,Dxk) to DIS(m,n,Dxk) of first original disparity DIS_k can be obtained with the following equations:

$$DvR^-(x, y) = \frac{1}{2}[DvR(x, y) + DvR(x-1, y)]$$

$$DvR^+(x, y) = \frac{1}{2}[DvR(x, y) + DvR(x+1, y)]$$

$$DvR_{Min}(x, y) = \text{Min}(DvR^-(x, y), DvR^+(x, y), DvR(x, y))$$

$$DvR_{Max}(x, y) = \text{Max}(DvR^-(x, y), DvR^+(x, y), DvR(x, y))$$

$$DIS(x, y, Dxk) = \text{Max}(0, DvL(x, y) - DvR_{Max}(x - Dxk, y),$$

$$DvR_{Min}(x - Dxk, y) - DvL(x, y))$$

Wherein x and y are respectively a natural number smaller than or equal to m and a natural number smaller than or equal to n, and the m×n pieces of original pixel-based disparities DIS(1,1,Dxk) to DIS(m,n,Dxk) respectively correspond to the m×n pixel I(1,1) to I(m,n).

Then the m×n pieces of original pixel-based disparities DIS(1,1,Dxk) to DIS(m,n,Dxk) are converted, so as to obtain m×n pieces of emulation voltage signals SV(1,1) to SV(m,n). Thus, emulation voltage signals SV(1,1) to SV(m,n) can be respectively provided to the data node C(1,1) to C(m,n) and Cp(1,1) to Cp(m,n). Besides, by means of achieving the redistribution of voltages, the m×n pieces of emulation voltage signals, i.e. the m×n pieces of output result data, are accordingly obtained on the diffusion nodes ND(1,1) to ND(m,n).

For example, the following equation can be obtained by applying Kirchhoff's circuit law on the operation of obtaining the output result data on the diffusion node ND(I,j):

$$I1+I2+I3+I4+Ic+Ip=0$$

The following equation can be obtained from the above equation:

$$\frac{V\_ND1 - V\_ND(i, j)}{R1} + \frac{V\_ND2 - V\_ND(i, j)}{R2} +$$

$$\frac{V\_ND3 - V\_ND(i, j)}{R3} + \frac{V\_ND4 - V\_ND(i, j)}{R4} +$$

$$\frac{V\_C - V\_ND(i, j)}{Rc} + \frac{V\_Cp - V\_ND(i, j)}{Rp} = 0$$

$$\left[\left(\frac{1}{R1} + \frac{1}{R2} + \frac{1}{R3} + \frac{1}{R4} + \frac{1}{Rc}\right) \frac{-1}{R1} \frac{-1}{R2} \frac{-1}{R3} \frac{-1}{R4}\right] \times$$

$$\begin{bmatrix} V\_ND(i, j) \\ V1 \\ V2 \\ V3 \\ V4 \end{bmatrix} = \left[\frac{V\_Cp}{Rc} + \frac{V\_Cp}{Rp}\right]$$

Wherein the matrix $$\begin{bmatrix} V\_ND(i, j) \\ V1 \\ V2 \\ V3 \\ V4 \end{bmatrix}$$

is the target matrix x, and the matrices $$\left[\left(\frac{1}{R1} + \frac{1}{R2} + \frac{1}{R3} + \frac{1}{R4} + \frac{1}{Rc}\right) \quad \frac{-1}{R1} \quad \frac{-1}{R2} \quad \frac{-1}{R3} \quad \frac{-1}{R4}\right]$$

and $$\left[\frac{V\_Cp}{Rc} + \frac{V\_Cp}{Rp}\right]$$

are respectively defined as a known matrix coefficient A and a matrix coefficient b.

In other words, the above recited equation can be written as the following equation:

Ax=b

Examples then are recited in the following paragraphs for having the operation of the data processing device 1 according to the present embodiment illustrated one step further. The data processing device 1 includes a determining unit 10, an iteration unit with fixed-value parameters 20, and an iteration unit with unfixed-value parameters 30. The determining unit 10 receives the target matrix x and determines whether the target matrix x corresponds to a low complexity condition; if so, the determining unit provides a first command CMD. If not, the determining unit provides a second command CMD.

In an example, the low complexity condition can be determined, by a user, as "an iteration with unfixed-value parameters" or "an iteration with fixed-value parameters". In other words, the low complexity condition can be determined by a selection controlling event provided by the user.

In other example, the low complexity condition can be determined by means of comparing the computed voltage value obtained in a present iteration and that obtained in the previous iteration. The next iteration is set as being the "iteration with fixed-value parameters" when a totaled overall variance, obtained in the present comparing operation, is smaller than a threshold TH_MODE. On the other hand, the next iteration is set as being the "iteration with unfixed-value parameters" when the totaled overall variance is greater than the threshold TH_MODE.

The iteration unit with fixed-value parameters 20 obtains a first updated target matrix, such as corresponding to a next target corresponding to a next iteration according to a first variance d and a first iteration parameter α, in response to the first command CMD1, wherein the first variance d is relevant to a second iteration parameter β, and the first and the second iteration parameters α and β corresponding to fixed values. In detail, the iteration unit with fixed-value parameters 20 includes a counting subunit 20a, a setup subunit 20b, and an iteration subunit 20c.

The counting subunit 20a resets a counting parameter i, which indicates a time that the iteration has been executed, and determines whether the counting parameter i corresponds to a terminal value $i_{max}$. The setup subunit 20b obtains a remainder parameter d according to an initial value of the target matrix x0 and the matrix coefficient b, wherein the remainder parameter d indicates gradient information around the initial value x0.

The iteration subunit 20c executes the iteration for the target matrix x with reference to the counting parameter i. More specifically, the iteration subunit 20c obtains the first updated target matrix according to the target matrix x, the remainder parameter d, and the first iteration parameter α. The iteration subunit 20c obtains the first variance according to the second iteration parameter β and the remainder parameter d, and has the remainder parameter d updated accordingly, so that the remainder parameter d indicates the gradient information around the updated target matrix, corresponding to a next iteration.

The counting subunit 20a has the counting parameter i ascended by 1 and accordingly determines whether the counting parameter i corresponds to a terminal value $i_{max}$ once again, after the remainder parameter d is updated, so as to determine whether to execute the next iteration.

For example, each subunits of the above mentioned iteration unit with fixed-value parameters 20 can be implemented with program codes capable of being executed by computer systems. In an embodiment, the operations executed by the iteration unit with fixed-value parameters 20 can be presented with the following pseudo-code:

i ⇐ 0
r ⇐ b−Ax
d ⇐ r
$\delta_{new}$ ⇐ $r^T r$
$\delta_0$ ⇐ $\delta_{new}$
while i<$i_{max}$
  x ⇐ x+αd
  d ⇐ r+βd
  i ⇐ i+1

Based on the above paragraph, the values of the first and the second iteration parameters α and β affect the weighting for the target matrix x in the next iteration, and the adjustments of the target matrix x gradually moves toward a convergence value until the target matrix finally achieves stability. In other words, each of the iterations is critically affected by the first and the second iteration parameters α and β. The iteration subunit with fixed-value parameters 20 achieves the corresponding iterations with fixed valued parameters, i.e. the first and the second iteration parameters α and β, so as to achieve the iteration of the target matrix x with lowered computational effort.

The iteration unit with unfixed-value parameters 30, in response to a second command CMD2, obtains second updated target matrix, e.g. corresponding to a target matrix of next iteration, according to a second variance and a third iteration parameter α', wherein the second variance is relevant to a fourth iteration parameter β', and the third and the fourth iteration parameters α' and β' are relevant to the target matrix x. In more detail, the iteration unit with unfixed-value parameters 30 includes a counting subunit 30a, a setup subunit 30b, an iteration subunit 30c, and a parameter controlling subunit 30d.

The counting subunit 30a and the setup subunit 30b operate similarly as the corresponding subunits of the iteration unit with fixed-value parameters 20, for respectively having a counting parameter i' configured and obtaining a remainder parameter d' according to the initial value of the target matrix x0, the matrix coefficient A and the matrix coefficient b.

When the counting parameter i' is not corresponding to a terminal value $i_{max}$', the iteration subunit 30c obtains a target matrix, corresponding to a next iteration, according to the target matrix, the remainder parameter d', and the third iteration parameter α', obtains the second variance according to the fourth iteration parameter β' and the remainder parameter d', and has the remainder parameter d' updated according to the second variance, so that the remainder parameter d' indicates the gradient information around the updated target matrix, corresponding to a next iteration.

The parameter controlling subunit 30d determines whether the third iteration parameter α' satisfies a first threshold THα', so as to accordingly determine whether the third iteration parameter α' reaches its stability. If so, the parameter controlling subunit 30d raises the weight of the third iteration parameter α' according to a weight coefficient k1, so as to expedite the iteration of the iteration subunit 30c. On the other hand, when the third iteration parameter α' has not reached its stability, the parameter controlling subunit 30d does no adjustment on the third iteration parameter α' or having the third iteration parameter α' adjusted with a weight coefficient k2 with lowered value.

Similarly, the parameter controlling subunit 30d determines whether the fourth iteration parameter β' satisfies a second threshold THβ', so as to determine whether the fourth iteration parameter β' reaches its stability. If so, the parameter controlling subunit 30d. If so, the parameter controlling subunit 30d raises the weight of the fourth iteration parameter β' according to a weight coefficient k3, so as to expedite the iteration of the iteration subunit 30c. On the other hand, when the fourth iteration parameter β' has not reached its stability, the parameter controlling subunit 30d does no adjustment on the fourth iteration parameter β' or having the fourth iteration parameter β' adjusted with a weight coefficient k4 with lowered value.

As such, the iteration unit with unfixed-value parameters 30 is different from the iteration unit with fixed-value parameter 20 in that the iteration unit with unfixed-value parameter 30 further employs the parameter controlling subunit 30d for selectively adjusting the third and the fourth iteration parameters α' and β' in response to the values thereof, so as to reduce the overall operation time needed for the operation of the iteration unit with unfixed-value parameter 30.

For example, each subunits of the above mentioned iteration unit with unfixed-value parameters 30 can be implemented with program codes capable of being executed by computer systems. In an embodiment, the operations executed by the iteration unit with unfixed-value parameters 30 can be presented with the following pseudo-code:

$$i' \Leftarrow 0$$
$$r' \Leftarrow b - Ax$$
$$d' \Leftarrow r'$$
$$\delta_{new} \Leftarrow r'^T r'$$
$$\delta_0 \Leftarrow \delta_{new}$$
while $i' < i'_{max}$ and $\delta_{new} > \varepsilon^2 \delta_0$
$$\alpha' \Leftarrow \frac{\delta_{new}}{d'^T A d'}$$
if $\alpha' \leq TH'_\alpha$
$$\alpha' \Leftarrow \alpha' \times k1$$
else
$$\alpha' \Leftarrow \alpha' \times k2$$
$$x \Leftarrow x + \alpha' d'$$
$$\delta_{old} \Leftarrow \delta_{new}$$
$$\delta_{new} \Leftarrow r'^T r'$$
$$\beta' = \frac{\delta_{new}}{\delta_{old}}$$
if $\beta' \leq TH'_\beta$
$$\beta' \Leftarrow \beta' \times k3$$
else -continued $$\beta' \Leftarrow \beta' \times k4$$
$$d' \Leftarrow r' + \beta' d'$$
$$i' \Leftarrow i' + 1$$

Based on the above paragraph, the iteration unit with unfixed-value parameters 30 employs the parameter controlling subunit 30d for determining whether the third and the fourth iteration parameters α' and β' reach their stability in each of the iterations, and accordingly, as well as selectively, adjusting the values of the third and the fourth iteration parameters α' and β', so as to expedite the iteration of the iteration unit with unfixed-value parameters 30, and reduce the overall operation time needed for the operation of the iteration unit with unfixed-value parameter 30.

Figure 4:
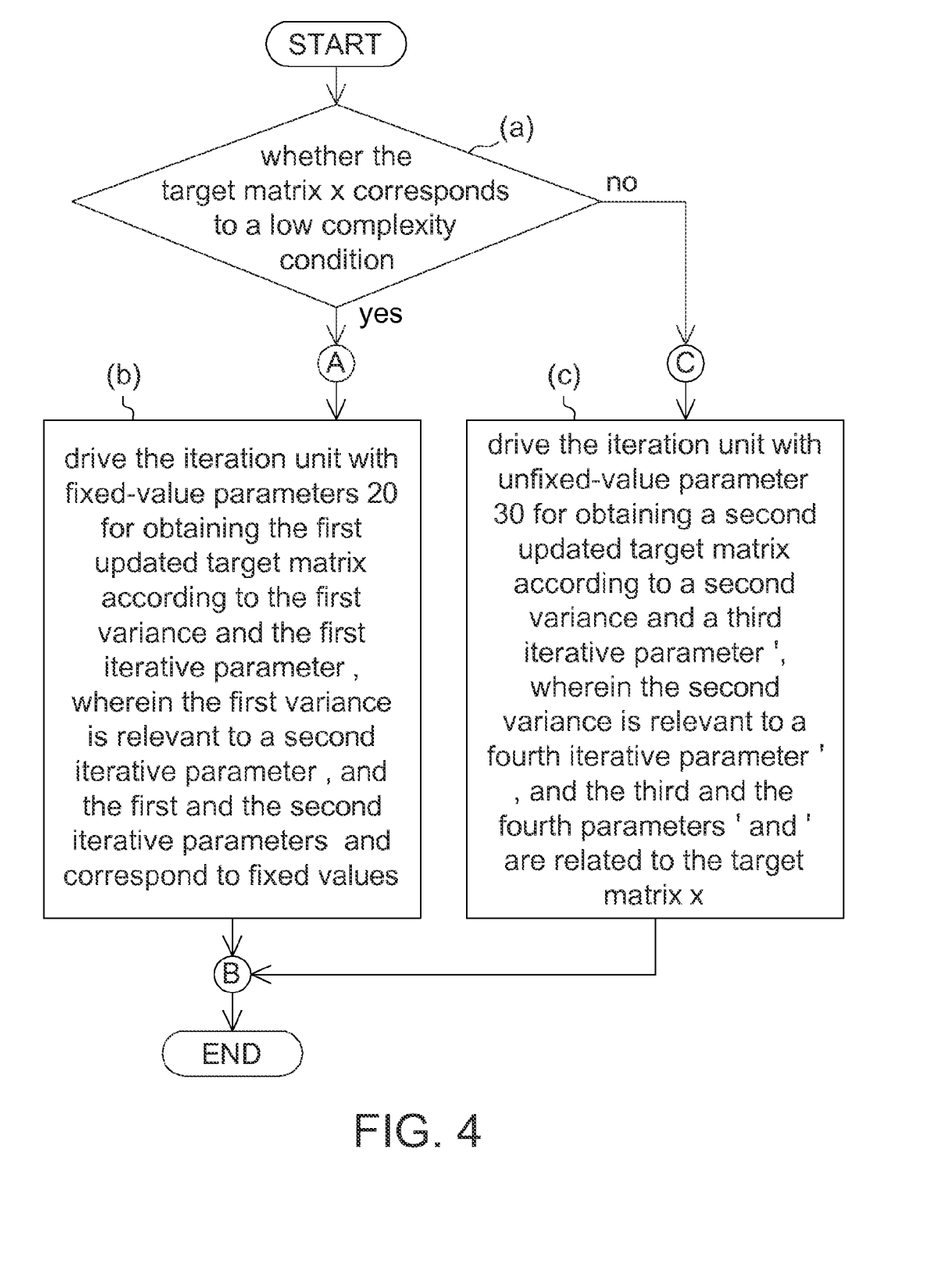
FIG. 4 is a flow chart of the data processing method according to the present embodiment.

Referring to FIG. 4, a flow chart of the data processing method according to the present embodiment is shown. The data processing method according to the present embodiment includes the following steps for achieving iterative approximation of a target matrix. The method firstly executes step (a), in which the determining unit 10 is employed for determining whether the target matrix x corresponds to a low complexity condition. If so, the method proceeds to step (b), in which the iteration unit with fixed-value parameters 20 is driven for obtaining the first updated target matrix according to the first variance and the first iteration parameter α, wherein the first variance is relevant to a second iteration parameter β, and the first and the second iteration parameters α and β correspond to fixed values.

On the other hand, when the target matrix x does not correspond to the low complexity condition, the method proceeds to step (c), in which the iteration unit with unfixed-value parameter 30 is driven for obtaining a second updated target matrix according to a second variance and a third iteration parameter α', wherein the second variance is relevant to a fourth iteration parameter β', and the third and the fourth iteration parameters α' and β' are related to the target matrix x.

Figure 5:
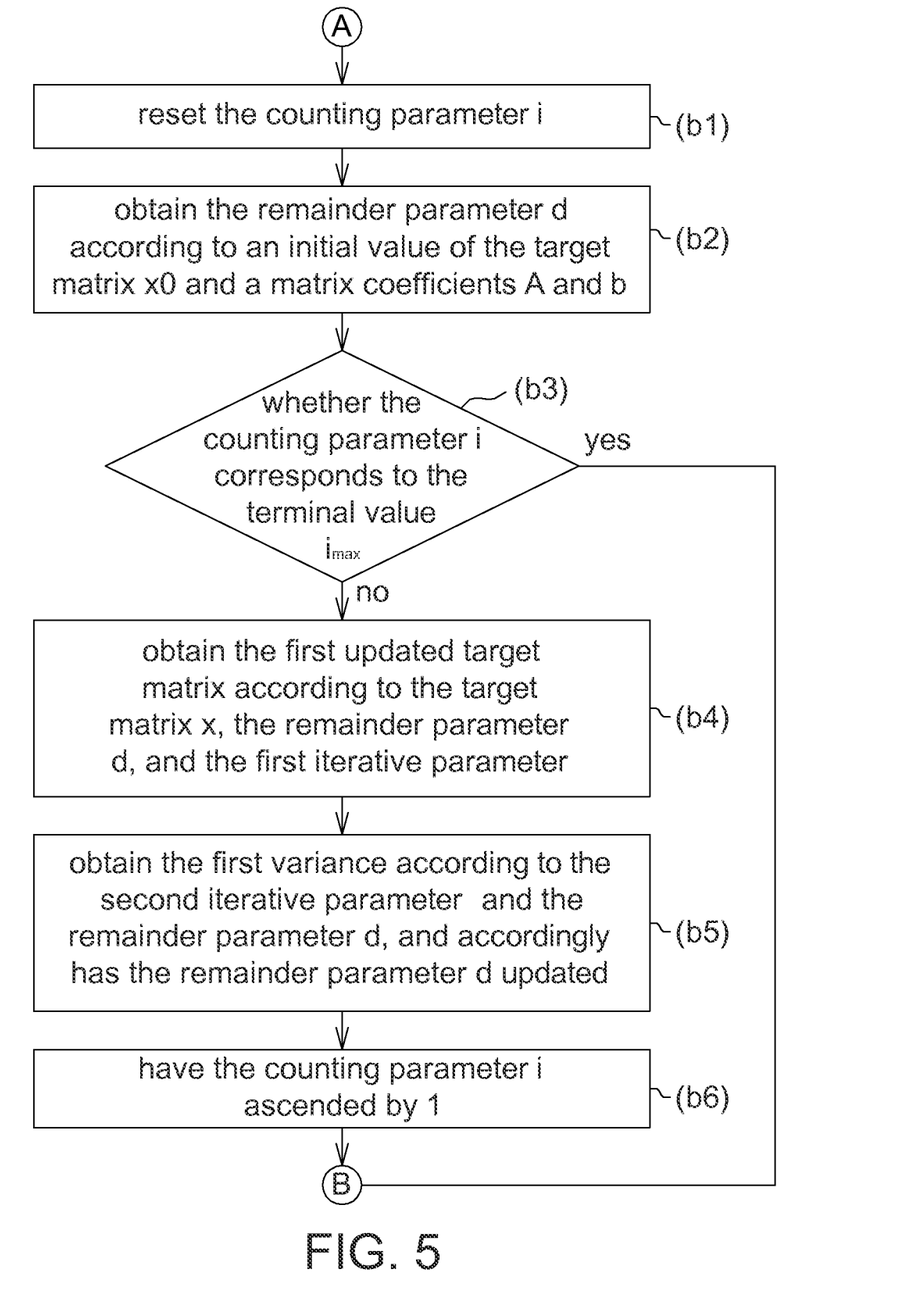
FIG. 5 is a detailed flow chart for step (b) of the data processing method.

Referring to FIG. 5, a detailed flow chart for step (b) of the data processing method is shown. For example, step (b) mentioned above further includes sub-steps (b1) to (b6). Firstly, sub-step (b1) is executed, wherein the counting subunit 20a resetting the counting parameter i, which indicates a time that the iteration operation has been executed. Next, sub-step (b2) is executed, wherein the remainder parameter d is obtained according to an initial value of the target matrix x0 and a matrix coefficients A and b, wherein the remainder parameter d indicates gradient information around the initial value x0.

Then sub-step (b3) is executed, wherein the counting subunit 20a determines whether the counting parameter i corresponds to the terminal value imax by the counting subunit. If not, the method proceeds to sub-step (b4), in which the iteration subunit 20c obtains the first updated target matrix according to the target matrix x, the remainder parameter d, and the first iteration parameter α. The method then proceeds to sub-step (b5), in which the iteration subunit 20c obtains the first variance according to the second iteration parameter β and the remainder parameter d, and accordingly has the remainder parameter d updated, so that the remainder parameter d indicates the gradient information around the first updated target matrix, corresponding to a next iteration. After that, the method proceeds to sub-step (b6), the counting subunit 20a has the counting parameter i ascended by 1 and repeating the sub-step (b3) after sub-step (b5).

Figure 6:
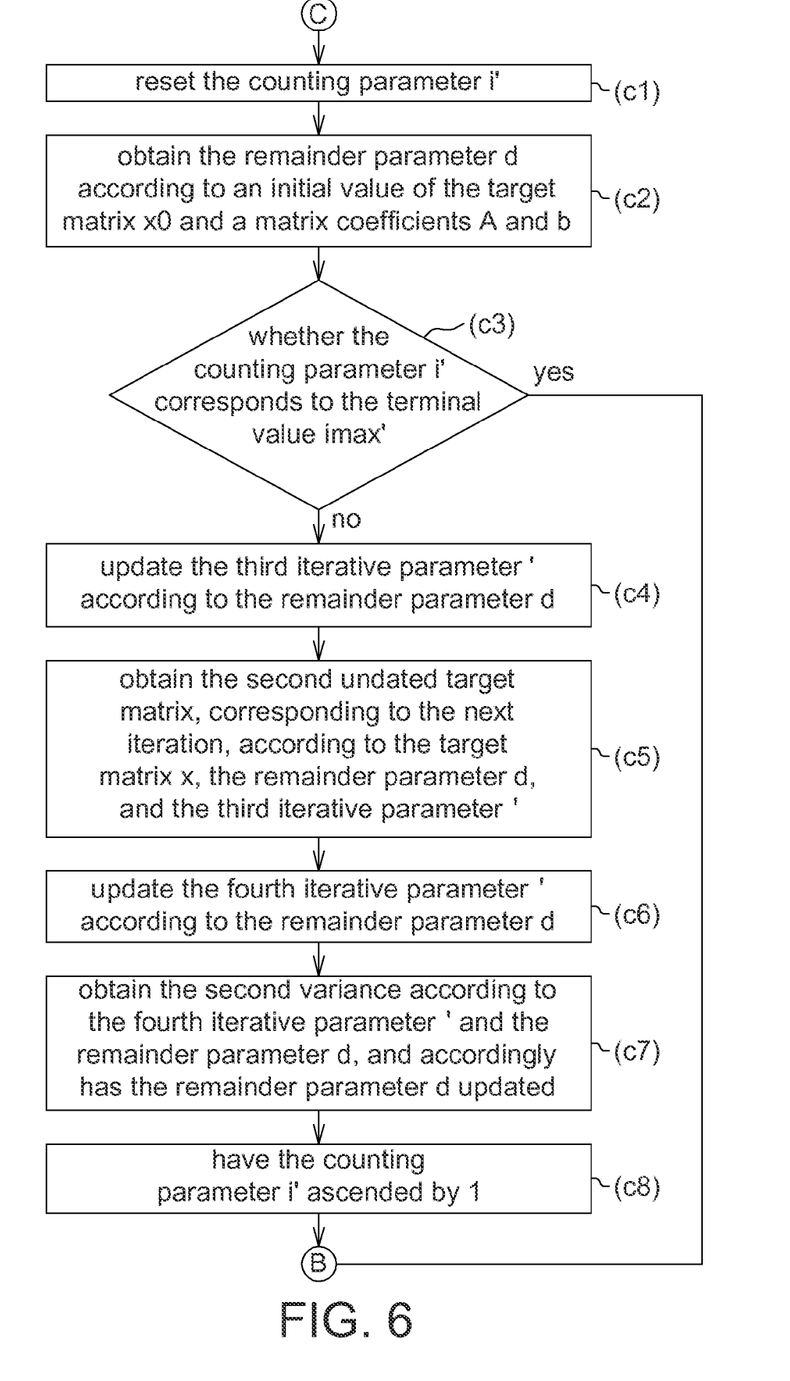
FIG. 6 is a detailed flow chart for step (c) of the data processing method.

Referring to FIG. 6, a detailed flow chart for step (c) of the data processing method is shown. Step (c) mentioned above, for example, includes sub-steps (c1) to (c8). In an example, sub-steps (c1) to (c3) are substantially the same as the corresponding sub-steps (b1) to (b3) of step (b), and the corresponding illustration is accordingly omitted.

After step (c3), when the counting parameter i does not correspond to the terminal value $i_{max}'$, the method proceeds to step (c4), in which the parameter controlling subunit 30d updates the third iteration parameter α' according to the remainder parameter d. The method next proceeds to step (c5), in which the iteration subunit 30c obtains the second undated target matrix, corresponding to the next iteration, according to the target matrix x, the remainder parameter d, and the third iteration parameter α'. The method then proceeds to step (c6), in which the parameter controlling subunit 30d updates the fourth iteration parameter β' according to the remainder parameter d. The method next proceeds to step (c7), in which the iteration subunit 30c obtains the second variance according to the fourth iteration parameter β' and the remainder parameter d, and accordingly has the remainder parameter d updated, so that the remainder parameter d indicates gradient information around the second updated target matrix, corresponding to a next iteration. After that, the method proceeds to step (c8), in which the counting subunit 30a has the counting parameter i' ascended by 1 and repeating step (c3).

The data processing method according to the present embodiment determines whether a target matrix corresponds to a low complexity condition; if so, the data processing method drives an iteration unit with fixed-value parameters for obtaining first updated target matrix according to first variance and first iteration parameter, wherein the first variance is relevant to second iteration parameter, and the first and the second iteration parameters have fixed values. On the other hand, when the target matrix does not correspond to a low complexity condition, the data processing method drives an iteration unit with unfixed-value parameters for obtaining second updated target matrix according to second variance and third iteration parameter, wherein the second variance is relevant to fourth iteration parameter, and the third and the fourth iteration parameters are relevant to the target matrix. In other words, the data processing method according to the present embodiment selectively executes iterative approximations corresponding to different computational complexity according to the predetermined condition that whether the target matrix corresponds to the low complexity condition. Therefore, in comparison to conventional image processing schemes, the data processing method and device using the same is advantageously capable of selectively achieving iterative approximations corresponding to different computational complexity in response to target matrices corresponding to different conditions, e.g. the low complexity condition.

While the disclosure has been described by way of example and in terms of the exemplary embodiment(s), it is to be understood that the disclosure is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A computer implemented data processing method applied in a data processing system for achieving iterative approximation of a target matrix, comprising:

determining whether the target matrix corresponds to a low complexity condition by a determining unit of a data processing device;

when the target matrix corresponds to the low complexity condition, driving an iteration unit with fixed-value parameters of the data processing device by the determining unit for obtaining a first updated target matrix according to a first variance and a first iteration parameter, wherein the first variance is relevant to a second iteration parameter, and the first and the second iteration parameters correspond to fixed values; and when the target matrix does not correspond to the low complexity condition, driving an iteration unit with unfixed-value parameters of the data processing device by the determining unit for obtaining a second updated target matrix according to a second variance and a third iteration parameter, wherein the second variance is relevant to a fourth iteration parameter, and the third and the fourth parameters are related to the target matrix.

2. The data processing method according to claim 1, wherein the step of obtaining the first updated target matrix further comprises:

resetting a counting parameter, which indicates a time that an iteration has been executed by a counting subunit of the iteration unit with fixed-value parameters; and obtaining a remainder parameter according to an initial value of the target matrix and a matrix coefficient, wherein the remainder parameter indicates gradient information around the initial value, by a setup subunit of the iteration unit with fixed-value parameters.

3. The data processing method according to claim 2, wherein the step of obtaining the first updated target matrix further comprises:

determining whether the counting parameter corresponds to a terminal value by the counting subunit;

obtaining the first updated target matrix according to the target matrix, the remainder parameter, and the first iteration parameter, when the counting parameter does not correspond to the terminal value by an iteration subunit of the iteration unit with fixed-value parameters; and obtaining the first variance according to the second iteration parameter and the remainder parameter and accordingly having the remainder parameter updated by the iteration subunit, so that the remainder parameter indicates gradient information around the first updated target matrix, corresponding to a next iteration.

4. The data processing method according to claim 3, wherein the step of having the remainder parameter updated is further followed by steps of:

having the counting parameter ascended by 1 and repeating the step of determining whether the counting parameter corresponding to the terminal value by the counting subunit.

5. The data processing method according to claim 1, wherein the step of obtaining the second updated target matrix further comprises:

resetting a counting parameter, which indicates a time that an iteration has been executed by a counting subunit of the iteration unit with unfixed-value parameters; and obtaining a remainder parameter according to an initial value of the target matrix and a matrix coefficient, wherein the remainder parameter indicates gradient information around the initial value by a setup subunit of the iteration unit with unfixed-value parameters.

6. The data processing method according to claim 5, wherein the step of obtaining the second updated target matrix further comprises:
- determining whether the counting parameter corresponds to a terminal value by the counting subunit;
- updating the third iteration parameter according to the remainder parameter, when the counting parameter does not correspond to the terminal value by a parameter controlling subunit of the iteration unit with unfixed-value parameters;
- obtaining the second undated target matrix according to the target matrix, the remainder parameter, and the third iteration parameter by an iteration subunit of the iteration unit with unfixed-value parameters;
- updating the fourth iteration parameter according to the remainder parameter by the parameter controlling subunit; and
- obtaining the second variance according to the fourth iteration parameter and the remainder parameter and accordingly having the remainder parameter updated by the iteration subunit, so that the remainder parameter indicates gradient information around the second updated target matrix, corresponding to a next iteration.

7. The data processing method according to claim 6, wherein the step of having the remainder parameter updated is further followed by steps of:
- having the counting parameter ascended by 1 and repeating the step of determining whether the counting parameter corresponding to the terminal value by the counting subunit.

8. The data processing method according to claim 6, wherein the step of updating the third iteration parameter further comprises:
- determining whether the updated third iteration parameter is greater than or equal to a first threshold by the parameter controlling subunit;
- when the updated third iteration parameter is greater than or equal to the first threshold, having the updated third iteration parameter adjusted according to a first weight coefficient by the parameter controlling subunit; and
- when the updated third iteration parameter is smaller than the first threshold, having the updated third iteration parameter adjusted according to a second weight coefficient by the parameter controlling subunit.

9. The data processing method according to claim 6, wherein the step of updating the fourth iteration parameter further comprises:
- determining whether the updated fourth iteration parameter is greater than or equal to a second threshold by the parameter controlling subunit;
- when the updated fourth iteration parameter is greater than or equal to the second threshold, having the updated fourth iteration parameter adjusted according to a third weight coefficient by the parameter controlling subunit; and
- when the updated fourth iteration parameter is smaller than the second threshold, having the updated fourth iteration parameter adjusted according to a fourth weight coefficient by the parameter controlling subunit.

10. A data processing device, applied in a data processing system for achieving iterative approximation of a target matrix, comprising:
- a determining unit, receiving the target matrix and determining whether the target matrix corresponds to a low complexity condition, wherein when the target matrix corresponds to the low complexity condition, the determining unit provides a first command, and when the target matrix does not corresponds to the low complexity condition, the determining unit provides a second command;
- an iteration unit with fixed-value parameters, obtaining a first updated target matrix according to a first variance and a first iteration parameter in response to the first command, wherein the first variance is relevant to a second iteration parameter, and the first and the second iteration parameters correspond to fixed values; and
- an iteration unit with unfixed-value parameters, obtaining a second updated target matrix according to a second variance and a third iteration parameter in response to the second command, wherein the second variance is relevant to a fourth iteration parameter, and the third and the fourth parameters are related to the target matrix.

11. The data processing device according to claim 10, wherein the iteration unit with fixed-value parameters further comprises:
- a counting subunit, resetting a counting parameter, which indicates a time that an iteration has been executed; and
- a setup subunit, obtaining a remainder parameter according to an initial value of the target matrix and a matrix coefficient, wherein the remainder parameter indicates gradient information around the initial value, wherein
- the counting subunit further determines whether the counting parameter corresponds to a terminal value.

12. The data processing method according to claim 11, wherein the iteration unit with fixed-value parameters further comprises:
- an iteration subunit, obtaining the first updated target matrix according to the target matrix, the remainder parameter, and the first iteration parameter, when the counting parameter does not correspond to the terminal value, wherein
- the iteration subunit obtains the first variance according to the second iteration parameter and the remainder parameter and accordingly having the remainder parameter updated, so that the remainder parameter indicates gradient information around the first updated target matrix, corresponding to a next iteration.

13. The data processing device according to claim 12, wherein the counting subunit has the counting parameter ascended by 1 and once again determines whether the counting parameter corresponding to the terminal value, after the remainder parameter is updated by the iteration subunit, so as to execute a next iteration operation.

14. The data processing device according to claim 10, wherein the iteration unit with unfixed-value parameters further comprises:
- a counting subunit, resetting a counting parameter, which indicates a time that an iteration has been executed; and
- a setup subunit, obtaining a remainder parameter according to an initial value of the target matrix and a matrix coefficient, wherein the remainder parameter indicates gradient information around the initial value, wherein
- the counting subunit further determines whether the counting parameter corresponds to a terminal value.

15. The data processing device according to claim 14, wherein the iteration unit with unfixed-value parameters further comprises:
- a parameter controlling subunit, updating the third iteration parameter and the fourth iteration parameter according to the remainder parameter, when the counting parameter does not correspond to the terminal value; and
- an iteration subunit, obtaining the second undated target matrix according to the target matrix, the remainder parameter, and the third iteration parameter, wherein the iteration subunit further obtains the second variance according to the fourth iteration parameter and the remainder parameter and accordingly having the remainder parameter updated, so that the remainder parameter indicates gradient information around the second updated target matrix, corresponding to a next iteration.

16. The data processing device according to claim 15, wherein the counting subunit further has the counting parameter ascended by 1 and once again determines whether the counting parameter corresponding to the terminal value, after the remainder parameter is updated by the iteration subunit, so as to execute a next iteration operation.

17. The data processing device according to claim 15, wherein the parameter controlling subunit determines whether the updated third iteration parameter is greater than or equal to a first threshold; when the updated third iteration parameter is greater than or equal to the first threshold, the parameter controlling subunit has the updated third iteration parameter adjusted according to a first weight coefficient, wherein,
when the updated third iteration parameter is smaller than the first threshold, the parameter controlling subunit has the updated third iteration parameter adjusted according to a second weight coefficient.

18. The data processing device according to claim 15, wherein the parameter controlling subunit further determines whether the updated fourth iteration parameter is greater than or equal to a second threshold; when the updated fourth iteration parameter is greater than or equal to the second threshold, the parameter controlling subunit has the updated fourth iteration parameter adjusted according to a third weight coefficient, wherein
when the updated fourth iteration parameter is smaller than the second threshold, the parameter controlling subunit has the updated fourth iteration parameter adjusted according to a fourth weight coefficient.

* * * * *